WAVE-BAND SWITCH FOR TELEVISION RECEIVERS

Filed Jan. 16, 1968 2 Sheets-Sheet 1

INVENTOR:
ALBERT HABIAN
BY Kurt Kelman
AGENT

INVENTOR:
ALBERT HABIAN
BY Kurt Kelman
AGENT

United States Patent Office 3,482,178 Patented Dec. 2, 1969

3,482,178

WAVE-BAND SWITCH FOR TELEVISION RECEIVERS

Albert Habian, Vincennes, France, assignor to Societe Orega Electronique & Mecanique, a corporation of France Filed Jan. 16, 1968, Ser. No. 698,328
Claims priority, application France, Jan. 25, 1967, 92,481
Int. Cl. H03f *3/04, 3/10;* H04q *3/00*
U.S. Cl. 330—30 4 Claims

ABSTRACT OF THE DISCLOSURE

A wave-band switch for radio or television receiver comprises a transistor having a base connected to the very-high frequency input, an emitter connected to the ultra-high freqeuncy input and a collector selectively connected to the ultra-high frequency stages or to the very-high frequency stages. The base is grounded through a capacitor and an inductor connected in series and tuned to the ultra-high frequency band. A first diode connects the emitter, in its blocked state, to the very-high frequency input and, in its conductive state, to the ground. A second diode connects the base, in its blocked state, to the very-high frequency input and, in its conductive state, to ground.

The present invention relates to wave-band switches for television receivers.

It is well known that one of the important problems in television receiver technique is to provide a wave-band switch, making it possible to receive the very-high frequency bands I, II and III and the ultra-high frequency bands IV and V with common input circuits.

According to the invention there is provided a wave-band switch comprising: a transistor having a base, an emitter and a collector; a capacitor and an inductor connected in series and tuned to the ultra-high frequency band connecting said base to ground; a first diode for connecting an ultra-high frequency input to said emitter and a second diode for connecting a very-high frequency input to said base, means for selectively making said diodes conductive or blocking them; an ultra-high frequency output and a very-high frequency output; and means for selectively connecting to said collector, said ultra-high frequency output and said very-high frequency output.

For a better understanding of the invention and to show how the same may be carried into effect, reference will be made to the drawing accompanying the following description and wherein.

Figure 1:
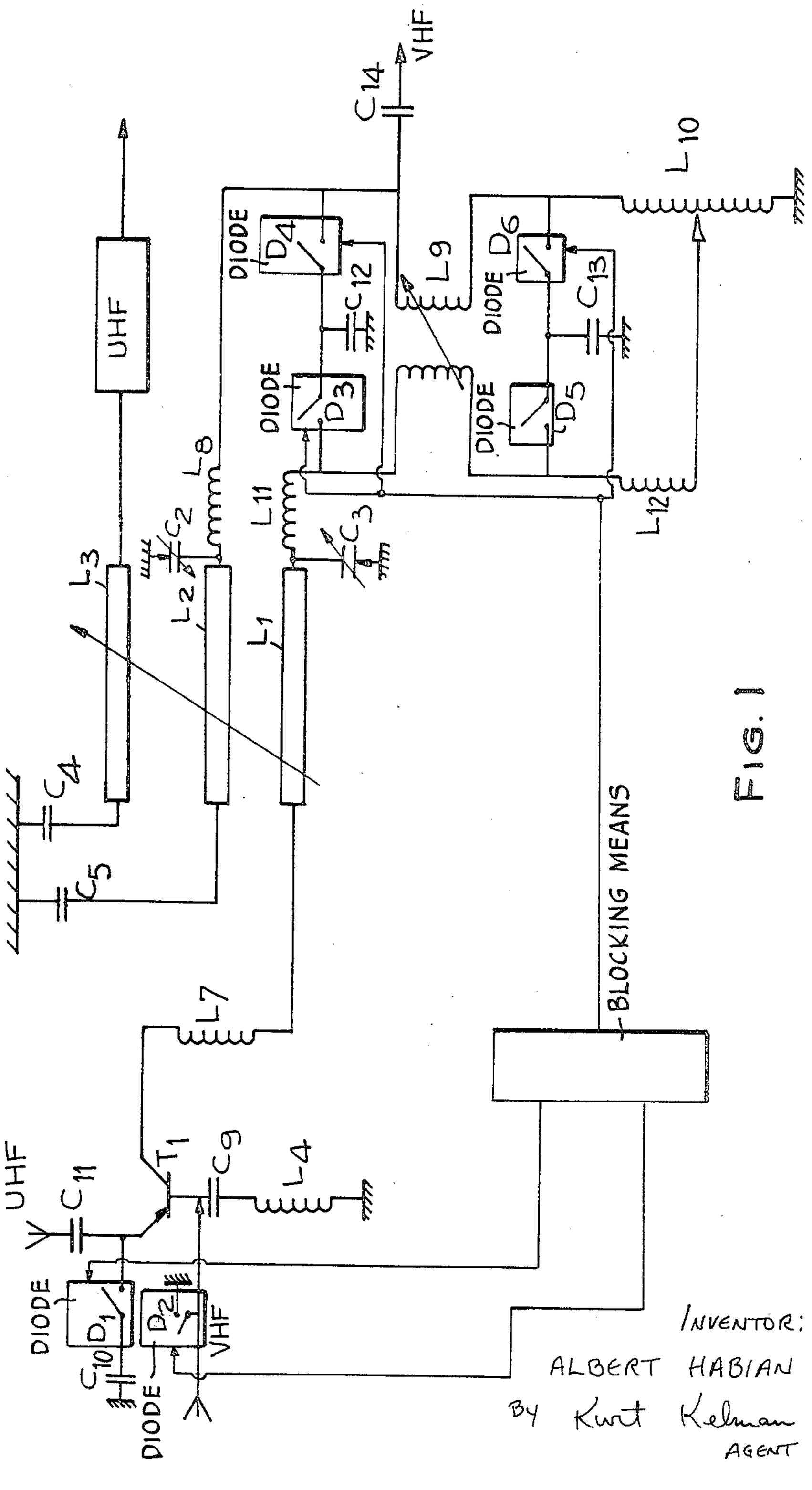
FIG. 1 shows diagrammatically the principle of the invention.

As may be seen in FIG. 1 a transistor $T_1$ forms the input of a receiver. The ultra-high frequency signals are applied to the emitter of the transistor $T_1$ through a capacitor $C_{11}$.

The emitter is grounded through a capacitor $C_{10}$ and a diode $D_1$. The diode is blocked in the case of the ultra-high frequency operation and is conducting in the case of the very-high frequency operation.

The very-high frequency signal is applied to the base of the transistor through a diode $D_2$. The base of the transistor $T_1$ is grounded through an inductance coil $L_4$ and a capacitor $C_9$, in series and forming a resonance circuit, i.e. a short circuit, in the ultra-high frequency range. The circuit is tuned, for example, for 860 mc./s.

The collector of the transistor $T_1$ is connected through an inductance coil $L_7$ to a half-wave line $L_1$, coupled to two other half-wave lines $L_2$ and $L_3$, the wavelength corresponding to the ultra-high frequency operation. A varactor $C_3$ connects the other end of the line $L_1$ to ground and a varactor $C_2$ connects to ground the corresponding end of the line $L_2$. The lines $L_2$ and $L_3$ are grounded through respective capacitors $C_5$ and $C_4$. The line 3 leads to the ultra-high frequency stages. The ends of the $L_1$ and $L_2$, which are grounded through varactors $C_3$ and $C_2$, are also connected to ground through two different circuits.

The circuit connecting line $L_2$ to earth comprises an inductance coil $L_8$, the secondary winding of the transformer $L_9$ and the inductance coil $L_{10}$.

The circuit connecting line $L_1$ to ground comprises an inductance coil $L_{11}$, the primary winding of the transformer $L_9$, and the inductance coil $L_{12}$, connected to ground through a movable contact mounted on the inductance coil $L_{10}$.

Two diodes $D_3$ and $D_4$, which are conducting in ultra-high frequency operation, and blocked in very-high frequency operation, connect the inductance coils $L_8$ and $L_{11}$ to ground through a capacitor $C_{12}$. Under the same conditions, two other diodes $D_5$ and $D_6$ connect the windings of the transformer $L_9$ to ground through a capacitor $C_{13}$. The evry-high frequency signal is taken from the output of $L_8$ by a connecting capacitor $C_{14}$. The diodes are simultaneously blocked or rendered by the blocking means B.

Figures 2, 3:
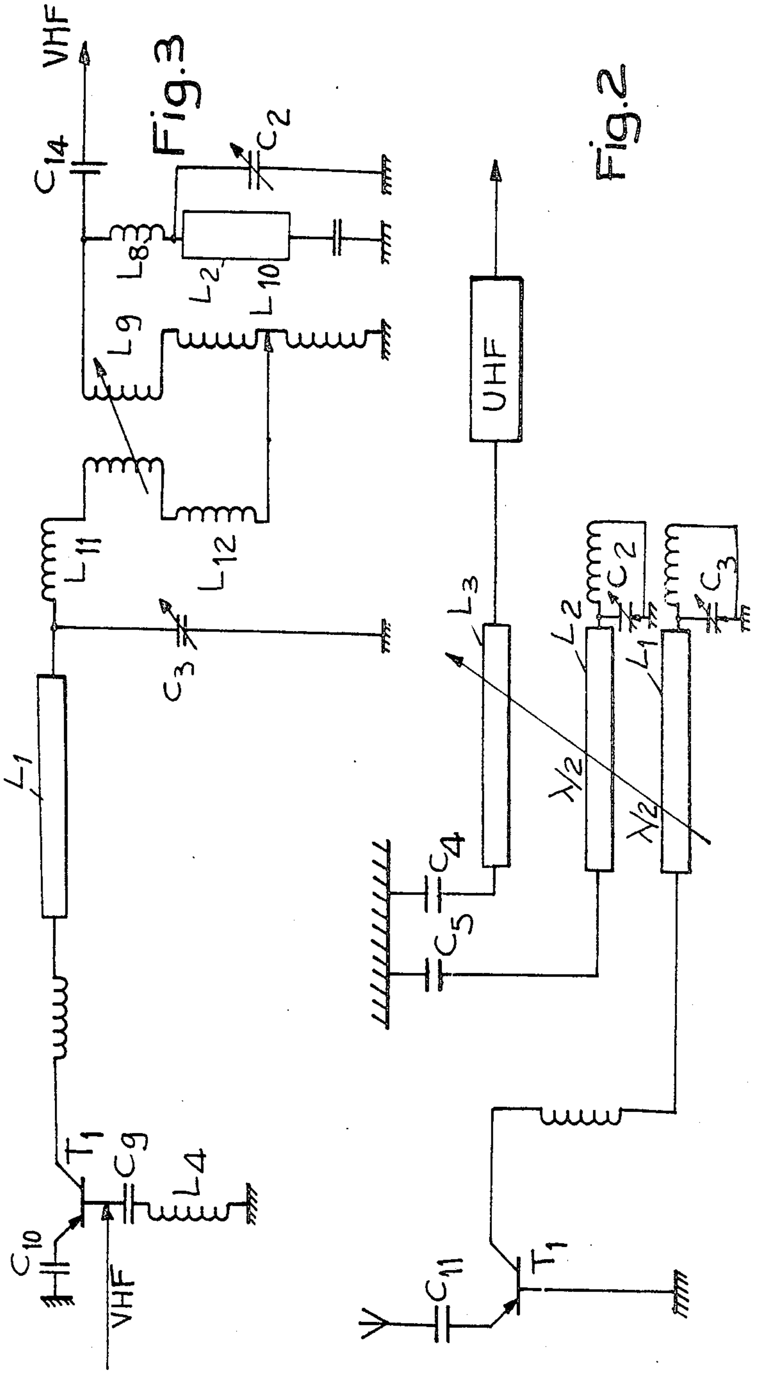
FIG. 2 shows the ultra-high frequency circuit.
FIG. 3 shows the very-high frequency circuit.

FIG. 2 shows the operation under ultra-high frequency conditions. The ultra-high frequency signal is applied through the capacitor $C_{11}$ to the emitter of the transistor $T_1$, whose base is grounded through the coil $L_4$ and the capacitor $C_9$ which form a short circuit, and are not shown.

The varactors $C_2$ and $C_3$ are adjusted to make half-wave lines $L_1$ and $L_2$ the seat of standing waves. Line $L_1$ is coupled to line $L_2$ and line $L_2$ is coupled to line $L_3$, which feeds the ultra-high frequency stages.

FIG. 3 shows the operation under the very-high frequency conditions. The base of the transistor is, in fact, not grounded, since the $C_9$–$L_4$ circuit is no longer tuned. The input very-high frequency energy is applied to the base of the transistor $T_1$, whose emitter is grounded. The line $L_3$, whose length may be disregarded, considering the wavelength of the received signals, is not shown in FIG. 3.

Insofar as the lines $L_1$ and $L_2$ are concerned, their coupling coefficient may also be disregarded and they are in fact mere transmission lines.

The line $L_1$ forms, with the coil 11, the primary winding of the transformer $L_9$, the coil 12 and the varactor $C_3$, which is suitably adjusted, a first tuned circuit. The line $L_2$ forms, with the varactor $C_2$, which is suitably adjusted, the coil $L_8$, the secondary winding of the transformer $L_9$ and the coil $L_{10}$, a second tuned circuit.

These tuned circuits are coupled to each other thus forming a band-pass filter. The output signal is collected across the capacitor $C_{14}$.

Of course, the invention is not limited to the embodiments described and shown which were given solely by way of example.

What is claimed is:

1. A wave-band switch comprising: a transistor having a base, an emitter and a collector; a capacitor and an inductor connected in series and tuned to the ultra-high frequency band connecting said base to ground; a first diode for connecting an ultra-high frequency input to said emitter and a second diode for connecting a very-high frequency input to said base, means for selectively making said diodes conductive or blocking them; an ultra-high frequency output and a very-high frequency output; and means for selectively connecting to said collector, said ultra-high frequency output and said very-high frequency output.

2. A wave-band switch as claimed in claim 1, wherein said first diode connects said ultra-high frequency input to ground, in its conducting state, and to said emitter in its blocked state.

3. A wave-band switch as claimed in claim 1, wherein said second diode connects said very-high frequency input to ground in its conducting state, and to said base in its blocked state.

4. A wave-band switch as claimed in claim 1, wherein said selectively connecting means comprise: an ultra-high frequency circuit and a very-high frequency circuit, said ultra-high frequency circuit comprising a first, a second, a third $\lambda/2$ transmission line coupled to each other, $\lambda$ being the wavelength of the operating ultra-high frequency wave, said first line being coupled to said collector and said third line being coupled to said ultra-high frequency output; said very-high frequency circuit comprising a band-pass filter, tuned to said very-high frequency band, interconnecting said first and said second lines, said filter having an output coupled to said very-high frequency output; and diode switching means for selectively short-circuiting, said band-pass filter.

References Cited

UNITED STATES PATENTS 3,376,508 4/1968 Jones ---------------- 334—45 X

ROY LAKE, Primary Examiner

JAMES B. MULLINS, Assistant Examiner

U.S. Cl. X.R.

330—31; 334—47